(12) United States Patent
Gambuzza

(10) Patent No.: US 10,911,006 B2
(45) Date of Patent: Feb. 2, 2021

(54) LINEAR ISOLATION AMPLIFIER AND METHOD FOR SELF-CALIBRATION THEREOF

(71) Applicant: LITTELFUSE, INC., Chicago, IL (US)

(72) Inventor: Michael Gambuzza, Boston, MA (US)

(73) Assignee: Littelfuse, Inc., Chicago, IL (US)

( * ) Notice: Subject to any disclaimer, the term of this patent is extended or adjusted under 35 U.S.C. 154(b) by 112 days.

(21) Appl. No.: 16/354,407

(22) Filed: Mar. 15, 2019

(65) Prior Publication Data
US 2020/0295715 A1  Sep. 17, 2020

(51) Int. Cl.
  *H03F 3/08* (2006.01)
  *H03K 5/24* (2006.01)
  *H03M 1/66* (2006.01)

(52) U.S. Cl.
  CPC ............... *H03F 3/085* (2013.01); *H03K 5/24* (2013.01); *H03M 1/66* (2013.01)

(58) Field of Classification Search
  CPC ............ H03F 3/085; H03K 5/24; H03M 1/66
  See application file for complete search history.

(56) References Cited

U.S. PATENT DOCUMENTS

| 3,811,094 A | 5/1974 | Lee | |
|---|---|---|---|
| 4,536,715 A * | 8/1985 | Basarath | H03F 3/38 330/2 |
| 10,044,447 B2 * | 8/2018 | Levin | H04B 10/802 |
| 2001/0033190 A1 | 10/2001 | Bendall | |
| 2009/0224186 A1 | 9/2009 | Khalil | |
| 2017/0098635 A1 | 4/2017 | Chen | |
| 2019/0121381 A1 * | 4/2019 | Jankowski | G01R 31/2856 |
| 2019/0190470 A1 * | 6/2019 | Bachus | H03F 3/68 |

FOREIGN PATENT DOCUMENTS

DE   2016214263   2/2018

OTHER PUBLICATIONS

International Search Report and Written Opinion dated Jul. 16, 2020 for PCT Application, PCT/US2020/023808 filed Mar. 20, 2020.

* cited by examiner

*Primary Examiner* — Patricia T Nguyen
(74) *Attorney, Agent, or Firm* — Kacvinsky Daisak Bluni PLLC

(57) ABSTRACT

An amplifier circuit may include an isolated amplifier circuit, disposed on a high voltage side of the amplifier circuit, and arranged to generate an isolated output signal. The amplifier circuit may include a first optocoupler circuit, disposed to receive the isolated output signal from the isolated amplifier circuit and an output amplifier circuit, disposed on a low voltage side of the amplifier circuit, and coupled to receive an optical output signal from the optocoupler circuit. The amplifier circuit may also include a calibration circuit, coupled to the output amplifier circuit, to generate a calibration initiation signal, and a second optocoupler circuit, disposed to receive the calibration initiation signal, and to output a switch signal, wherein a reference voltage is output to the isolated amplifier circuit.

17 Claims, 7 Drawing Sheets

LINEAR ISOLATION AMPLIFIER AND METHOD FOR SELF-CALIBRATION THEREOF

BACKGROUND

Field

Embodiments relate to the field of circuit protection devices, including noise filters.

Discussion of Related Art

Linear isolation circuits are known, such as linear optoisolators, also known as optocouplers. Known linear optoisolation circuitry includes optical emitters that generate radiant flux across a galvanically-isolated path. Receivers are provided that recover the initial analog signals across an electrically isolated barrier. This facilitates passing analog sense or control signals across electrically isolated circuits such as in power supply designs. Applications of optocouplers include use in linear isolation amplifiers and related circuitry. One feature of linear amplifiers based on optocouplers is the relation between input voltage VIN and output voltage VOUT, given by VOUT=VIN*K3 R2/R1, where R2 is the value of a resistor on the output side and R1 is the value of a resistor on the input side. K3 is a constant referred to as the transfer gain. Because optocoupler circuitry involves semiconductor materials, including light emitting diodes, as well as photodetectors, the properties of linear amplifiers using such circuitry depends upon the properties of the materials of optocouplers, as well as other circuit components. In practice, variation in properties among different optocoupler-based linear isolation amplifiers using nominally the same manufacturing process may cause substantial variation in the value of K3, the transfer gain. For example, K3 may vary by 10%, 20%, or 30% over different lots of optocouplers, so that an isolation amplifier design must accommodate this variation. In particular, when a customer wants a value of 1.0 for transfer gain, and the value of K3 varies above or below this value depending upon the optocoupler lot, resistance needs to be added or subtracted from the isolation amplifier circuit to achieve the value of 1. One manner of accommodating this variation is to alter R1 and R2 values in the linear amplifier circuitry, requiring resistors to be altered or swapped. Also, if K3 varies within a given linear amplifier circuit for some reason over time, there is no way to correct for this variation once the amplifier circuitry has been finalized.

In view of the above, the present embodiments are provided.

BRIEF SUMMARY

In some embodiments, an amplifier circuit is provided, including an isolated amplifier circuit, disposed on a high voltage side of the amplifier circuit, and arranged to generate an isolated output signal. The amplifier circuit may include a first optocoupler circuit, disposed to receive the isolated output signal from the isolated amplifier circuit and an output amplifier circuit, disposed on a low voltage side of the amplifier circuit, and coupled to receive an optical output signal from the optocoupler circuit. The amplifier circuit may also include a calibration circuit, coupled to the output amplifier circuit, to generate a calibration initiation signal, and a second optocoupler circuit, disposed to receive the calibration initiation signal, and to output a switch signal, wherein a reference voltage is output to the isolated amplifier circuit.

In another embodiment, a method of calibrating a linear isolation amplifier may include switching the linear isolation amplifier from an OFF state to an ON state. The method may include sending a signal to a calibration pin, to set the calibration pin in a low state for a predetermined interval, wherein a low voltage is set on a cathode of a calibration light emitting diode (LED), disposed on a low voltage side of the linear isolation amplifier, wherein the calibration LED generates a light signal. The method may also include receiving the light signal at a photodetector, disposed on a high voltage side of the linear isolation amplifier, wherein a switch signal is generated by the photodetector. The method may further include receiving the switch signal at a reference switch, connected to a reference voltage source, wherein the reference switch changes from an open state to a closed state, wherein the reference voltage source is electrically connected to an input of a servo amplifier, and sends a reference voltage to the servo amplifier.

In another embodiment, a linear isolation amplifier may include a servo amplifier, disposed on a high voltage side of the linear isolation amplifier, and an output amplifier, disposed on a low voltage side of the linear isolation amplifier. The linear isolation amplifier may include a first optocoupler circuit, electrically coupled to an output side of the servo amplifier, and comprising a first LED, optically coupled to an input side of the output amplifier, and a calibration circuit, electrically coupled to the output amplifier, to generate a calibration initiation signal. The linear isolation amplifier may further include a second optocoupler circuit, electrically coupled to the calibration circuit, and disposed to receive the calibration initiation signal, and further comprising a second LED, optically coupled to a reference switch on the high voltage side, wherein the reference switch is arranged to reversibly provide a reference voltage to the servo amplifier.

DESCRIPTION OF EMBODIMENTS

Figure 1A:
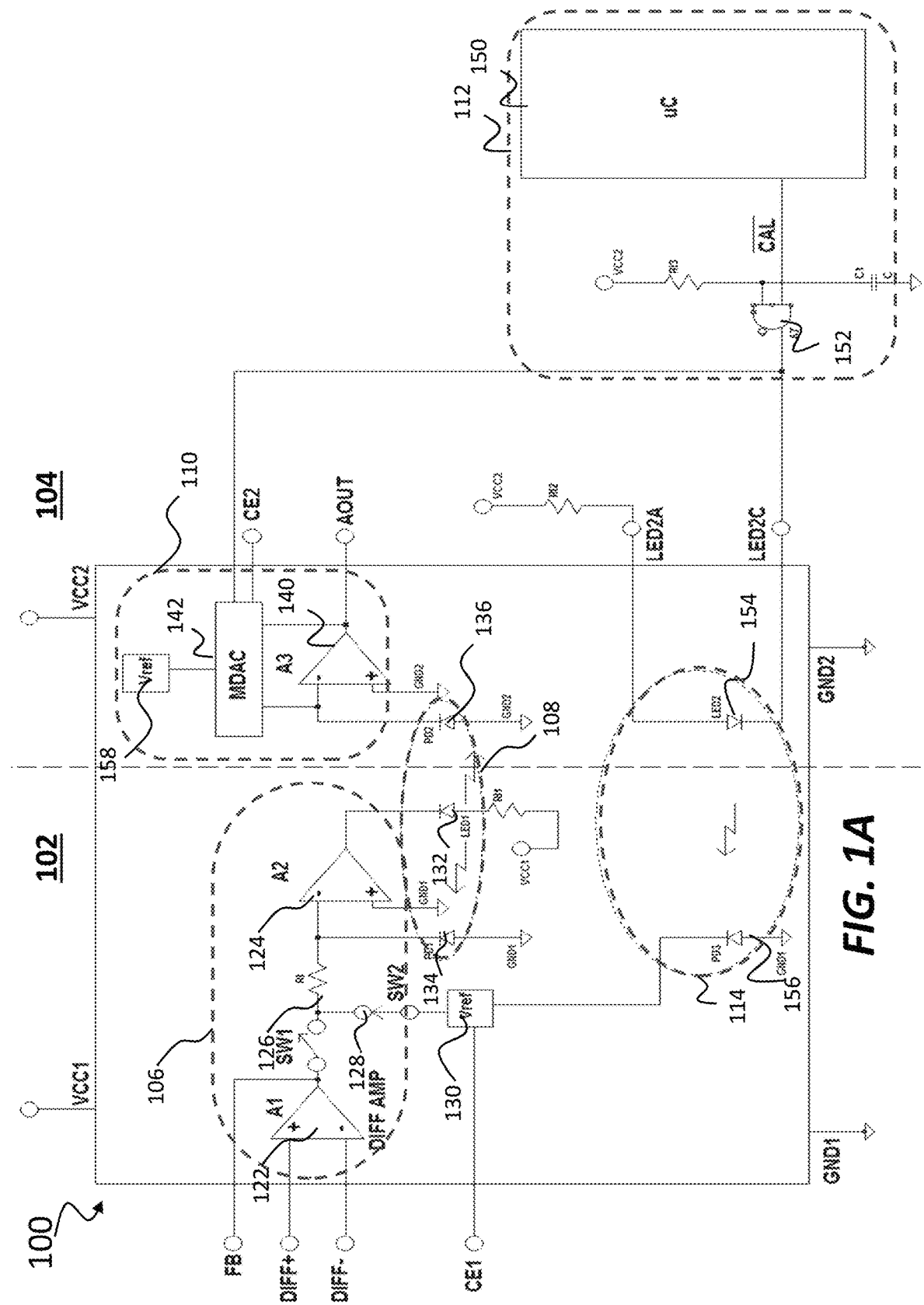
FIG. 1A shows an isolated amplifier circuit, in accordance with various embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

In various embodiments, systems, devices, and techniques are provided for automatic calibration of an isolation amplifier, such as for unity in transfer gain. According to some embodiments, as described hereinbelow, circuitry is disclosed to provide illustration of functional equivalents for implementing self-calibration of an isolation amplifier, where the details of actual components, and circuit arrangements for implementing the calibration may vary, as will be understood by those of ordinary skill in the art.

Turning to FIG. 1A there is shown an amplifier circuit 100, according to various embodiments of the disclosure. The amplifier circuit 100 may function as a unipolar linear amplifier according to various embodiments. The amplifier circuit 100 is arranged as a linear isolation amplifier, having a high voltage side 102 and low voltage side 104. For convenience of description, various portions of the amplifier circuit 100 may be grouped into various circuits that are linked together as shown, while other groupings are possible to describe the same amplifier circuit. As further shown in FIG. 1A, the amplifier circuit 100 includes an isolated amplifier circuit 106, disposed on the high voltage side 102 of the amplifier circuit 100, and arranged to generate an isolated output signal. The amplifier circuit 100 further includes a first optocoupler circuit 108, disposed to receive the isolated output signal from the isolated amplifier circuit 106, and an output amplifier circuit 110, disposed on a low voltage side 104 of the amplifier circuit 100, and coupled to receive an optical output signal from the first optocoupler circuit 108.

The amplifier circuit 100 further includes a calibration circuit 112, coupled to the output amplifier circuit 110, to generate a calibration initiation signal, and a second optocoupler circuit, 114, disposed to receive the calibration initiation signal, and to output a switch signal, so that a reference voltage is output to the isolated amplifier circuit 106. As such, the amplifier circuit 100 may be arranged to automatically perform a calibration (or self-calibration), for example, at system startup, or upon demand, wherein the transfer gain may be calibrated to a fixed value, such as "1".

In the embodiment specifically depicted in FIG. 1A, the isolated amplifier circuit 106 further includes a differential amplifier 122, having a differential amplifier output node, as well as a servo amplifier 124, having a servo output to generate the isolated output signal. This isolated output signal may cause the first optocoupler circuit 108 to generate an optical signal to be received by the low voltage side 104, as described below.

The isolated amplifier circuit 106 may include a first switch 126, which switch may act as a main switch, disposed between the differential amplifier output node and an input of the servo amplifier 124, and a second switch 128, coupled on a first side to the second optocoupler circuit 114, and coupled on a second side to the input of the servo amplifier. The isolated amplifier circuit 106 may further include a first reference voltage source 130, having an output coupled to the switch.

As depicted in FIG. 1A, the first optocoupler circuit 108 may be arranged similarly to known optocouplers, including a first light emitting diode (LED) 132, coupled between a voltage source line (VCC1) and the servo amplifier 124, a first photodetector 134, disposed on the high voltage side 102, coupled to receive an LED output from the first LED 132, and further coupled to the input of the servo amplifier 124. The first optocoupler circuit 108 may include a second photodetector 136, disposed on the low voltage side 104, coupled to receive the LED output from the first LED 132, and further coupled to output amplifier circuit 110.

As regards the output amplifier circuit 110, this circuit may include an output amplifier 140, having an input coupled to the second photodetector 136, and a multiplying digital to analog converter (MDAC) 142, coupled to the output amplifier 140 and to the calibration circuit 112.

In operation, the amplifier circuit 100 may be arranged to perform a calibration procedure, such as at startup, or upon user demand, in accordance with embodiments of the disclosure. Advantageously, the amplifier circuit 100 may be arranged to automatically calibrate the transfer gain to a value of 1, as detailed in the description to follow. To facilitate calibration upon startup, the calibration circuit 112 may include a controller 150, where the controller 150 may be arranged as a microcontroller to perform various known operations to control the amplifier circuit 100. For calibration procedures, the controller 150 may be arranged to output a control signal, where the calibration circuit 112 further includes a calibration pin 152 to receive the control signal and to output a LOW signal to the second optocoupler circuit 114, upon receipt of the control signal. For example, when the amplifier circuit 100 is powered on, the controller 150 may initiate a set of operations, including sending the control signal to the calibration pin 152 to hold the line low.

Figure 1B:
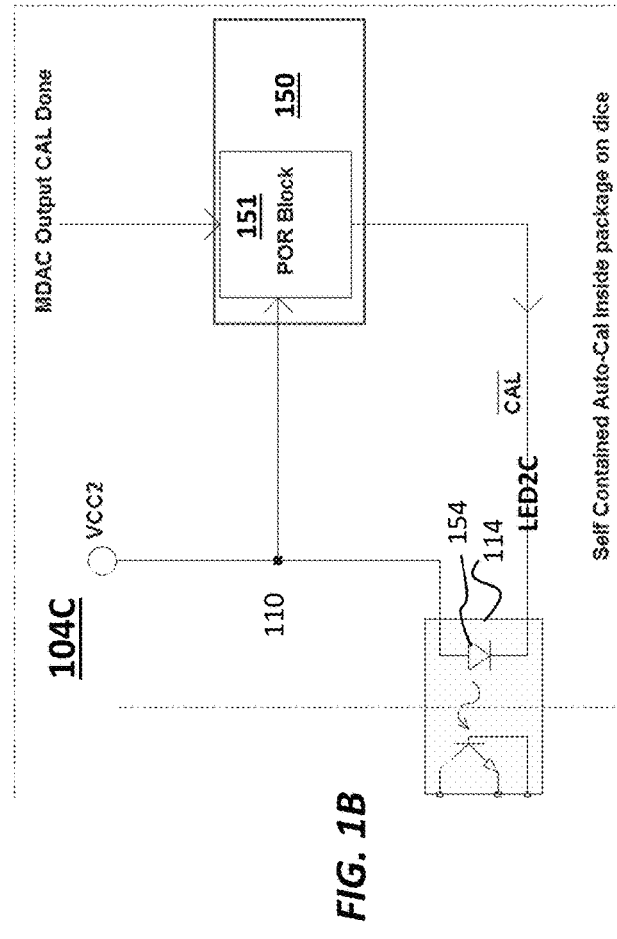
FIG. 1B illustrates an implementation of a calibration portion of the isolated amplifier circuit of FIG. 1A.
Figure 1C:
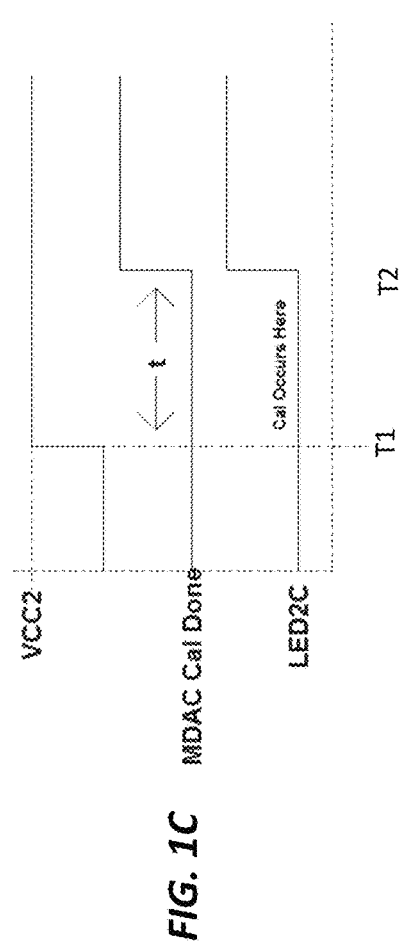
FIG. 1C illustrates the timing of signals of a calibration procedure according to embodiments of the disclosure.

According to some embodiments, the second optocoupler circuit 114 may include a second LED 154, acting as a calibration LED and coupled to receive the low signal from the calibration pin 152, so as to output a second LED signal. FIG. 1B illustrates an implementation of a calibration portion of the isolated amplifier circuit of FIG. 1A. As shown in FIG. 1B, the controller 150 may include a power on reset (POR) circuit 151. FIG. 1C illustrates the timing of signals of a calibration procedure according to embodiments of the disclosure, using the POR circuit 151, for example. The Y-axis indicates voltage and X-axis indicates time. As shown in FIG. 1C, when power is applied on low side, between time T1 and time T2, LED2C and MDAC input is held low, generating the low signal received by the second LED 154, to cause current to flow through the second LED 154. The low signal on LED2C continues until the MDAC indicates calibration is complete. At that time (T2) LED2C goes high, so the LED2C is turned off.

The second optocoupler circuit 114 may also include a third photodetector 156, coupled to receive the second LED signal and to output the switch signal that is sent to the isolated amplifier circuit 106.

In normal operation, the amplifier circuit 100 may work as an isolation amplifier where the amplifier circuit 100 is manufactured to generate a designed transfer gain, such as a value of 1 or 1.0, or 1.00, depending upon the degree of accuracy needed. Because of variations in properties of circuitry due to process variation used to form the various components, among other factors, the isolation amplifier 100, without correction, may yield a transfer gain different from the targeted value. Accordingly, in some implementations, the controller 150 may be configured to automatically, or upon user input, perform a calibration operation to automatically adjust the transfer gain to the target value, such as 1.0.

In one specific implementation, the first switch 126 is set to a closed position and second switch 128 is set to an open position during a powered off state. At the same time, the MDAC is set a default resistance value. Upon power up, the controller 150 may generate a signal that is sent to the calibration pin 152 to hold the calibration pin low, meaning the voltage on the line (LED2C) between the calibration pin 152 and the cathode of a calibration LED, meaning the second LED 154, is held low. At the same time, the anode of the second LED 154 is coupled to a VCC2 voltage source (disposed on the low voltage side 104) via line LED2A, where the voltage difference may cause the second LED 154 to generate a second LED signal that may be received by a detector, such as the third photodetector 156, disposed on the high voltage side 102. The controller 150 may be programmed to set the calibration pin 152 in a low state for a predetermined interval, so that the cathode voltage on the second LED 154 remains low and current flows through the second LED. When current flows through the P/N junction of the second LED 154, a light signal is generated by the second LED 154 during the predetermined interval.

As a consequence, the light signal generated by the second LED 154 is received by the third photodetector 156, on the high voltage side 102, for the predetermined interval. In different implementations, the third photodetector 156 may be arranged as a photodiode or a transistor, as shown in more detail in FIG. 2. The third photodetector 156, coupled to the first switch 126 and the second switch 128, may then generate a signal to change the first switch 126 from a closed to an open state, and to change the second switch 128 (reference switch) from an open state to a closed state.

As further illustrated in FIG. 1A, when the second switch 128 is in a closed state, the first reference voltage source 130 is electrically connected to the input of the servo amplifier 124 via the resistor R1. In one embodiment, for example, the first reference voltage source 130 may generate a voltage of 1.2 V that is applied through the resistor R1.

Notably, after the reference voltage is applied to the input of servo amplifier 124, in turn the servo amplifier 124 is arranged to output a signal, a voltage to the cathode of the first LED 132, disposed on the high voltage side 102. In turn, based upon the voltage of VCC1, coupled to the anode of the first LED 132, current will flow through the first LED 132, wherein a calibration light signal is generated, to be detected, for example, by the first photodetector 134, disposed on the high voltage side 102, as well as by the second photodetector 136, disposed on the low voltage side 104.

As further shown in FIG. 1A, the MDAC 142 is coupled to the calibration pin 152, and may therefore detect that the amplifier circuit 100 is in calibration mode during the predetermined interval, where the first switch 126 is open and second switch 128 is closed. Knowing that the reference voltage (e.g., 1.2 V) is being applied to the servo amplifier 124 and that a calibration mode is presently active, the MDAC 142 may adjust the output of the output amplifier 140 to match the voltage on the high voltage side 102, that is, to the reference voltage value form the first reference voltage source 130, such as 1.2 V. Accordingly, a transfer gain value of 1 (=1.2V/1.2V) will be established.

Returning to FIG. 1A, after the predetermined interval elapses, the controller 150 may send a second signal to bring the calibration pin 152 high (to a high state), turning off the second LED 154. Once the second LED 154 is turned off, the third photodetector 156 no longer receives a light signal, and the first switch 126 returns to a closed position, while the second switch 128 returns to an open position. The amplifier circuit 100 has now been calibrated to generate a transfer gain of 1, for example, as is ready for use.

Figure 2:
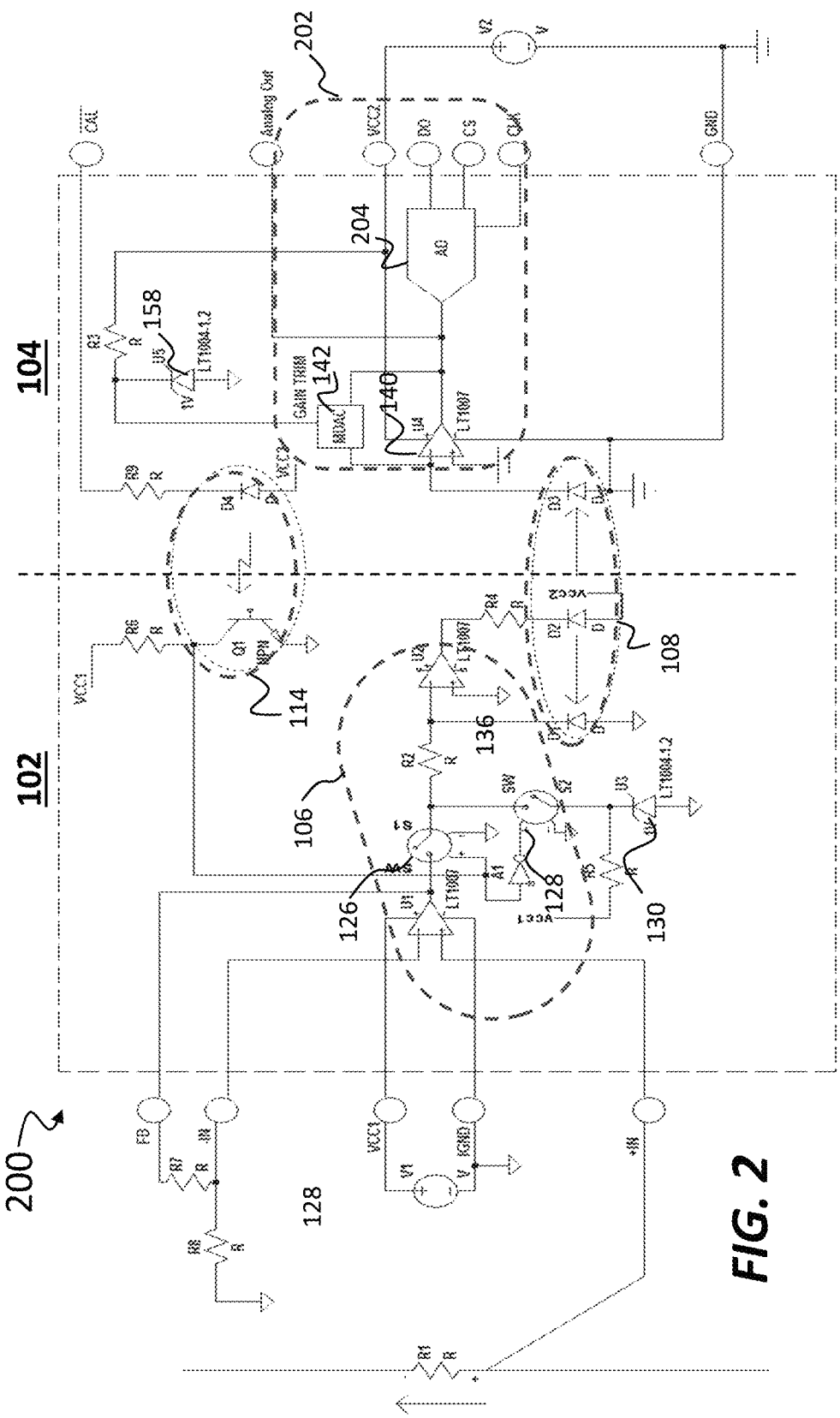
FIG. 2 shows another isolated amplifier circuit, in accordance with some embodiments of the disclosure.

In other embodiments of the disclosure, an analog to digital (ADC) converter may be added to the isolation amplifier circuitry as disclosed above. Turning to FIG. 2, there is shown an amplifier circuit 200, in accordance with further embodiments of the disclosure. In this embodiment, a circuit 202 on the low voltage side 104 is provided, including ADC 204, coupled to the MDAC 142 and the output amplifier 140. An integrated ADC allows the user to digitally resolve the value. This configuration, off-loads the user work to give a simple digital interface.

Figure 3:
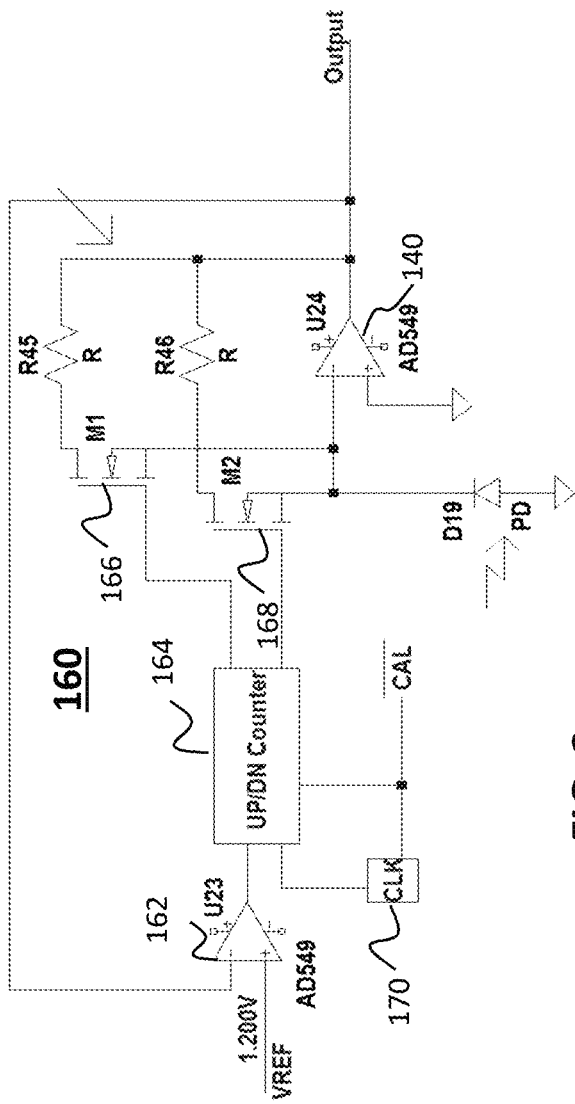
FIG. 3 shows one implementation of a digital to analog converter for trimming output of an amplifier, according to an embodiment of the disclosure

Turning now to FIG. 3, there is shown one circuit arrangement for performing autogain setting in an MDAC according to some embodiments of the disclosure. In this example, an MDAC arrangement 160 is shown, and may include a comparator 162, having a first input that receives a reference voltage, shown as VREF 1.200 V in FIG. 3. The comparator 162 includes a second input to receive an inverting input signal, which signal is generated at the output of the output amplifier 140, as shown in FIG. 3. The output of the comparator 162 is coupled to a counter 164 (an up/down counter), thus coupled to receive an output signal from the comparator 162. The counter 164 may be arranged to count up when the output signal from comparator 162 high, for example.

The MDAC arrangement 160 may further include a first FET assembly 166 and a second FET assembly 168, coupled to the counter 164. Each of first FET assembly 166 and second FET assembly 168 may include one or more field effect transistors, coupled to a given resistor (shown as R45 and R46), depending upon the desired resolution of transfer gain to be set. In other words, for an embodiment of an 8-bit counter, 8 field effect transistors in the MDAC arrangement 160. More generally, an n-bit counter will be provided with n field effect transistors.

In addition, the MDAC arrangement 160 also includes a clock 170, where the clock 170 is arranged to receive the calibration initiation signal (CAL) from the calibration pin 152, and to send a clock signal to the counter 164.

Assuming the case where transfer gain is to be set at 1 for an amplifier circuit, such as amplifier circuit 100, and assuming the reference voltage on the high voltage side is set at 1.2 V, then the output on the low voltage side, containing the MDAC arrangement 160, is also to be set at 1.2 V. Referring to FIG. 3, where the VREF 1.200 V is received at the first input of the comparator 162 (U23), the MDAC arrangement 160 may operate as follows. If the inverting input (inverting voltage) received from output amplifier 140 is below the VREF (meaning below 1.2 V is this particular example), the output of the comparator will go high (output a high signal) and the counter will count up. If the inverting input received from the output amplifier 140, on the other hand, is above VREF (i.e., >1.2 V), the comparator 162 will go low, and this low output will cause the counter 164 to count down. As noted, in FIG. 3, M1 and M2 represent N-number of FETs depending on desired gain resolution. As the counter 164 counts up, the FETs are turned off until the gain is set such that the output of output amplifier 140 is equal to 1.200V. In particular, the counter 164 may then count in a binary fashion turning on and off the different field effect transistors until the combined parallel resistances generate an output of the output amplifier 140 that matches the reference voltage to comparator 162. At some point, such as after a predetermined interval, the controller 150 will send a signal to the calibration pin 152 so that the calibration initiation signal is de-asserted and the clock 170 turns off. When the clock 170 turns off, the counter 164 is arranged to stay frozen in the last state (the current count state) representing the trimmed count at the instance the clock 170 is turned off.

Also, in accordance with embodiments of the disclosure, as calibration mode is exited, the amplifier, such as amplifier circuit 100 may self-configure as a standard LOC linear amplifier, except the trimming procedure performed according to FIG. 3, has set the transfer gain K3=1.

Figure 4A:
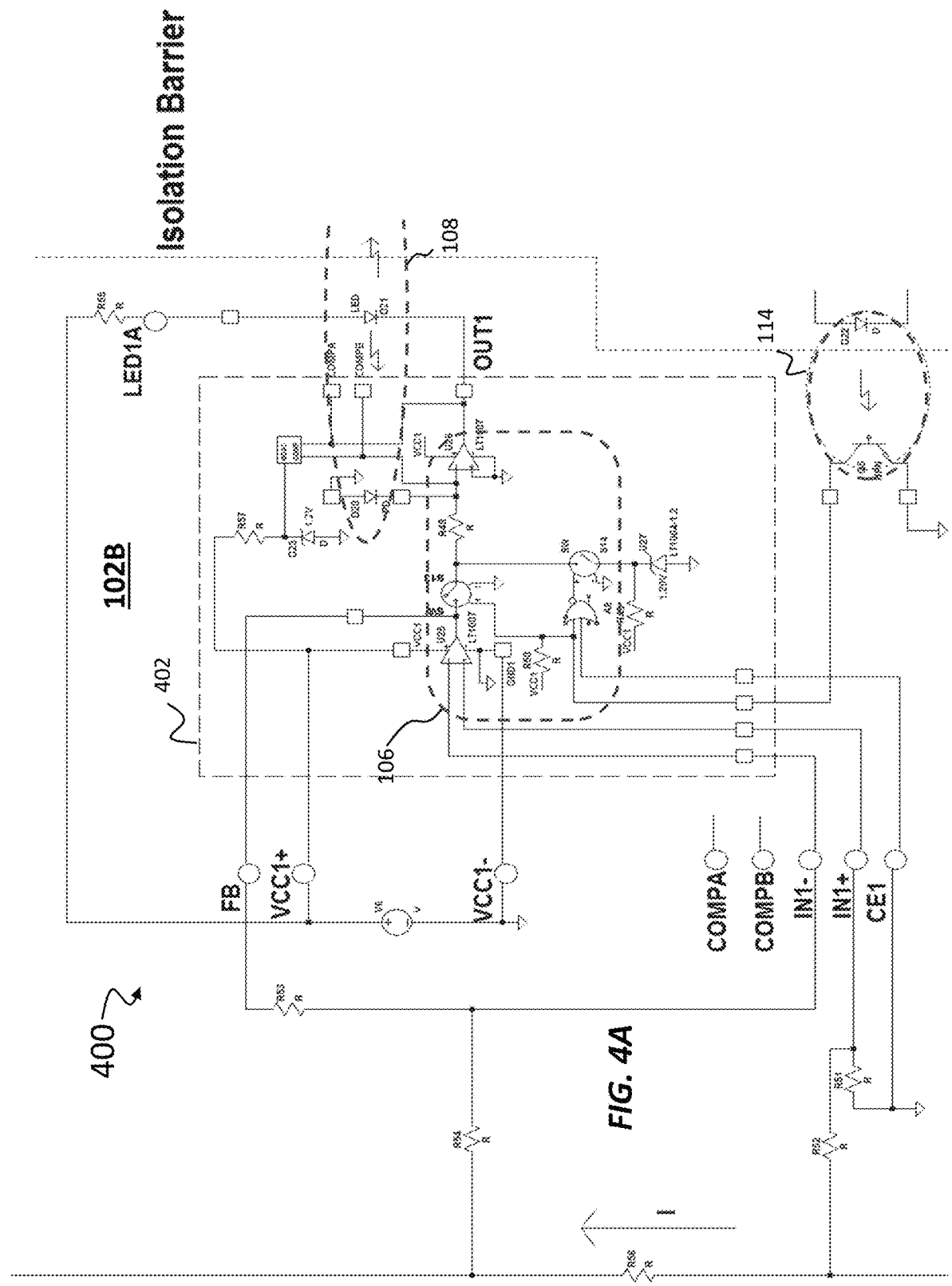
FIG. 4A and FIG. 4B depict another isolated amplifier circuit, according to further embodiments of the disclosure.
Figure 4B:
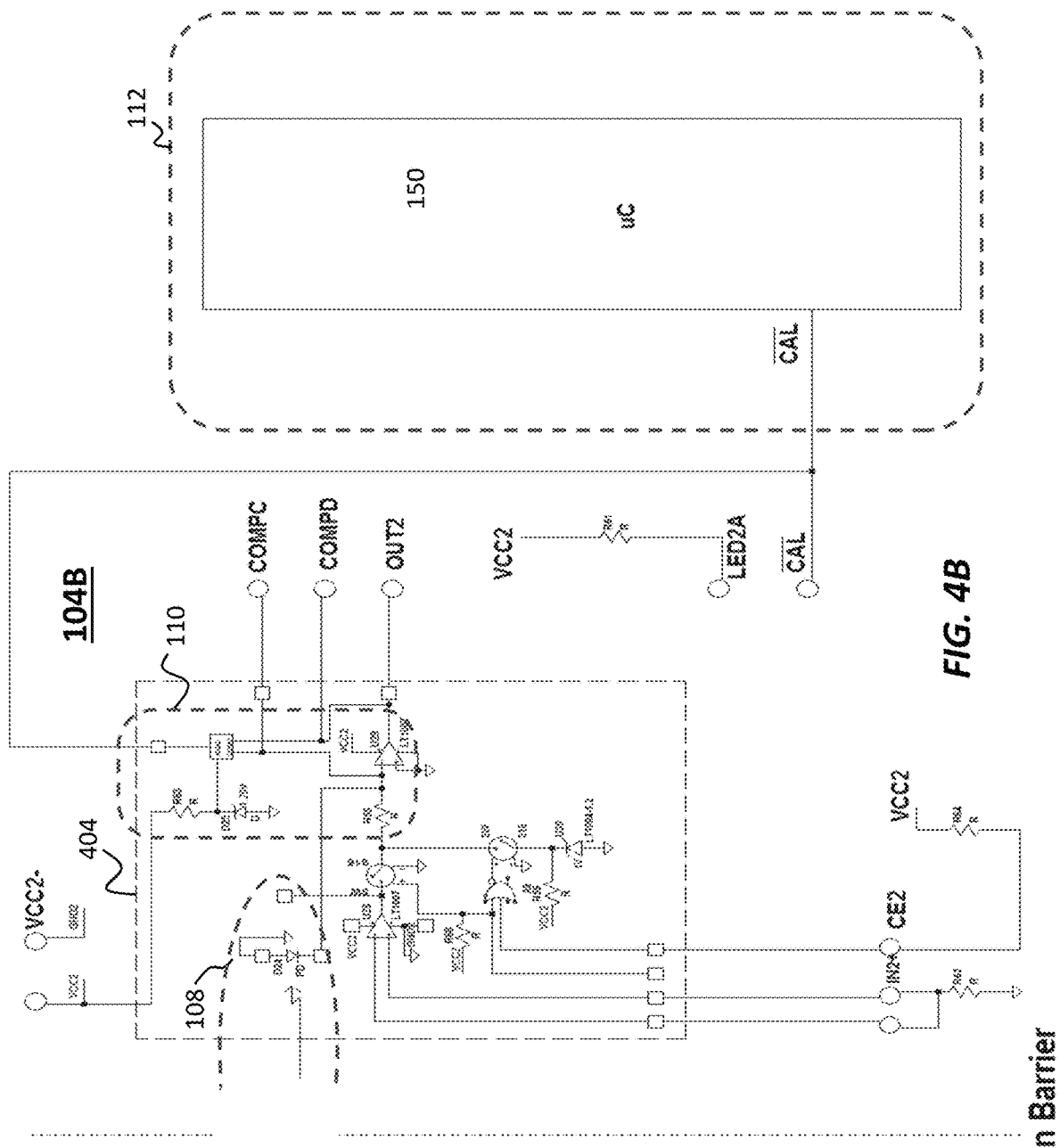

FIG. 4A and FIG. 4B depict another amplifier circuit, shown as amplifier circuit 400, according to further embodiments of the disclosure. In this embodiment, the same semiconductor die, shown as die 402 and die 404 may be used on both a high voltage side 102B and a low voltage side 104B of the amplifier circuit 400. This arrangement may employ bond out options to achieve the isolation amplifier function. The function pins are described in Table I when using on left side and right side of barrier. While not all the functions are used on each die of die 402 and die 404 in this "symmetric die" configuration, using the same dice has substantial advantages for manufacturing of an isolation amplifier, including allowing economies of scale. This approach allows one type of semiconductor wafer for fabricating the amplifier product instead of two different types of semiconductor wafer. This approach also provides the benefit where die to die variation is very small, since the die for the same amplifier may be manufactured on the same wafer.

TABLE I

| Signal Name | Left Side | Right Side | |
|---|---|---|---|
| FB | This is the feedback pin for Diff Amp U17 | Not Bonded out | Not Bonded out |
| VCC1+ | Power + | VCC2+ | Power + |
| VCC1− | Power − | VCC2− | Power − |
| IN1− | Inverting Input of Diff Amp U17 | IN2− | Inverting input of amplifier of U20 ground pin through resistor since not used |
| IN1+ | Non-Inverting input of Diff Amp U17 | IN2+ | Non-Inverting input of amplifier of U20 ground pin through resistor since not used |
| CE1 | Inhibit Calibration Cycle when Logic High. Tie low to enable. | CE2 | Inhibit Calibration Cycle when logic high. Tie high to inhibit. |
| OUT1 | Amplifier U18 output drives LED Cathode | OUT2 | Amplifier U21 output is composite amplifier output |
| M1, M2 | These pins control operation of MDAC per truth table. Disabled for left side. Disabled means MDAC is essentially out of the circuit completely. | M3, M4 | These pins control operation of MDAC per truth table. MDAC is enabled when *CAL is asserted low indicating calibration cycle start. |
| LED1A | Drives main LED Anode | N/A | N/A |
| COMPA, COMPB | Photo amplifier pins for external feedback compensation capacitor | COMPC, COMPD | Photo amplifier pins for external feedback compensation capacitor |

Figure 5:
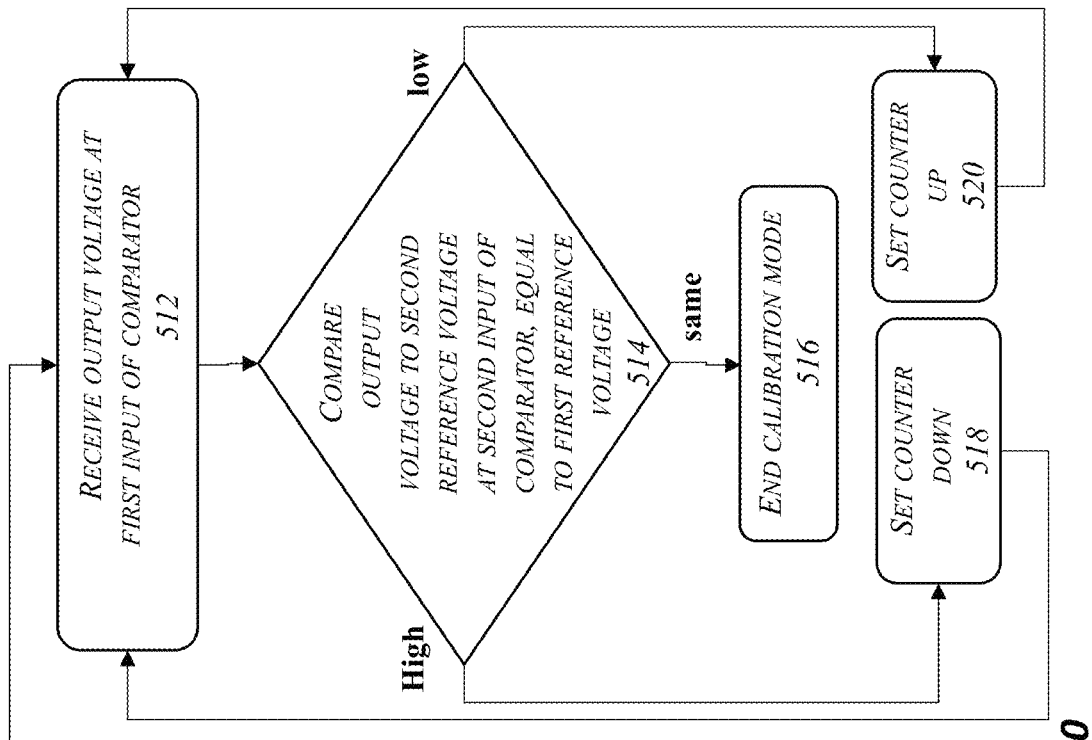
FIG. 5 depicts a process flow, according to embodiments of the disclosure.
Figure 5:
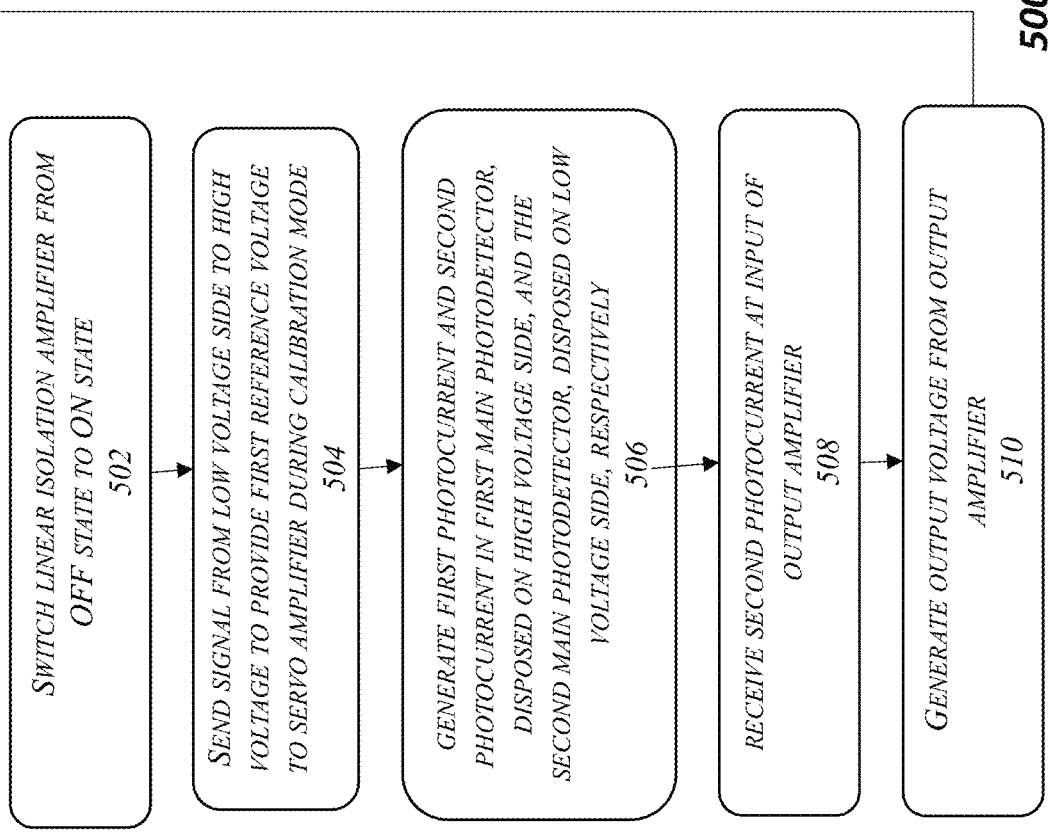

FIG. 5 depicts a process flow 500, according to embodiments of the disclosure. At block 502, a linear isolation amplifier is switched from an OFF state to an ON state. The switching on may trigger a microcontroller or other device to send a calibration initiation signal for a predetermined interval during the ON state. For example, the microcontroller may reside on a low voltage side of the linear isolation amplifier, and may send a signal to trigger a calibration pin to a low state.

At block 504, a signal is sent from a low voltage side to the high voltage side of the linear isolation amplifier to provide a first reference voltage to a servo amplifier. For example, the first reference voltage may represent a calibration voltage. In some implementations, the signal may be sent through an optocoupler between the low voltage side and high voltage side, causing a switch to couple a reference voltage source to the servo amplifier.

At block 506 a first photocurrent and second photocurrent are generated in a first main photodetector, disposed on the high voltage side, and a second main photodetector, disposed on the low voltage side, respectively. This photocurrent may be automatically generated by an optocoupler when the servo amplifier receives the first reference voltage.

At block 508, the second photocurrent is received at a first input of an output amplifier, disposed on the low voltage side. At block 510, the output amplifier generates an output voltage. At block 512, the output voltage is received at a first input of a comparator.

At decision block 514 the output voltage is compared to a second reference voltage received at a second input of the comparator. The second reference voltage may be set to be equal to the first reference voltage on the high voltage side. If the output voltage is the same as the second reference voltage, the flow proceeds to block 516, where the calibration mode ends.

If, at decision block 514, the output voltage is greater than the second reference voltage, the flow proceeds to block 518, where a counter, coupled to the output amplifier, is counted down. This counting down accordingly adjusts the input voltage to the output amplifier. The flow then returns to block 512.

If, at decision block 514, the output voltage is less than the second reference voltage, the flow proceeds to block 520, where a counter, coupled to the output amplifier, is counted up. This counting up accordingly adjusts the input voltage to the output amplifier. The flow then returns to block 512.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. An amplifier circuit, comprising:
an isolated amplifier circuit, disposed on a high voltage side of the amplifier circuit, and arranged to generate an isolated output signal;
a first optocoupler circuit, disposed to receive the isolated output signal from the isolated amplifier circuit;
an output amplifier circuit, disposed on a low voltage side of the amplifier circuit, and coupled to receive an optical output signal from the optocoupler circuit;
a calibration circuit, coupled to the output amplifier circuit, to generate a calibration initiation signal; and
a second optocoupler circuit, disposed to receive the calibration initiation signal, and to output a switch signal, wherein a reference voltage is output to the isolated amplifier circuit;
the isolated amplifier circuit comprising:
a differential amplifier, having a differential amplifier output node;
a servo amplifier, having a servo output to generate the isolated output signal;
a first switch, disposed between the differential amplifier output node and an input of the servo amplifier;
a second switch, coupled on a first side to the second optocoupler circuit, and coupled on a second side to the input of the servo amplifier; and
a first reference voltage source, having an output coupled to the second switch.

2. The amplifier circuit of claim 1, the first optocoupler circuit comprising:
a first light emitting diode (LED), coupled between a voltage source line and the servo amplifier; and
a first photodetector, disposed on the high voltage side, coupled to receive an LED output from the first LED, and further coupled to an input of the servo amplifier; and
a second photodetector, disposed on the low voltage side, coupled to receive the LED output from the first LED, and further coupled to output amplifier circuit.

3. The amplifier circuit of claim 2, an output amplifier circuit comprising:
an output amplifier, having an input coupled to the second photodetector; and
a multiplying digital to analog converter (MDAC), coupled to the output amplifier and to the calibration circuit.

4. The amplifier circuit of claim 3, further comprising an analog to digital converter, coupled to the MDAC and the output amplifier.

5. The amplifier circuit of claim 1, the calibration circuit, comprising:
a controller to output a control signal; and
a calibration pin coupled to receive the control signal and output a low signal to the second optocoupler circuit.

6. The amplifier circuit of claim 5, the second optocoupler circuit comprising:
a second LED, coupled to receive the low signal and to output a second LED signal; and
a third photodetector, coupled to receive the second LED signal and to output the switch signal.

7. The amplifier circuit of claim 3, the MDAC comprising:
a comparator having a first input to receive a reference voltage and a second input to receive an inverting input signal;
a counter, coupled to an output signal of the comparator, and arranged to count up when the output signal is high;
a first FET assembly and a second FET assembly, coupled to the counter; and
a clock to receive the calibration initiation signal and send a clock signal to the counter.

8. A method of calibrating a linear isolation amplifier, comprising:
switching the linear isolation amplifier from an OFF state to an ON state;
sending a signal to a calibration pin, to set the calibration pin in a low state for a predetermined interval, wherein a low voltage is set on a cathode of a calibration light emitting diode (LED), disposed on a low voltage side of the linear isolation amplifier, wherein the calibration LED generates a light signal;
receiving the light signal at a photodetector, disposed on a high voltage side of the linear isolation amplifier, wherein a switch signal is generated by the photodetector; and
receiving the switch signal at a reference switch, connected to a reference voltage source,
wherein the reference switch changes from an open state to a closed state, wherein the reference voltage source is electrically connected to an input of a servo amplifier, and sends a reference voltage to the servo amplifier.

9. The method of claim 8, further comprising:
sending a signal from the servo amplifier to a main LED, responsive to the reference voltage, wherein the main LED generates a calibration light signal;
receiving the calibration light signal at a first main photodetector, disposed on the high voltage side, and a second main photodetector, disposed on the low voltage side; and
generating a first photocurrent and second photocurrent in the first main photodetector and the second main photodetector, respectively;
receiving the second photocurrent at an output amplifier; and
adjusting an output voltage of the output amplifier to match the reference voltage.

10. The method of claim 8, further comprising receiving the switch signal at a main switch, the main switch being disposed between the servo amplifier and a differential amplifier, wherein the main switch moves from a closed position to an open position.

11. The method of claim 10, further comprising:
sending a second signal to the calibration pin, to set the calibration pin in a high state, after the predetermined interval,
wherein current ceases flowing through the calibration LED,
wherein the light signal ceases form the calibration LED,
wherein a second switch signal is received from the photodetector at the reference switch and the main switch, wherein the main switch changes from the open position to the closed position, and wherein the reference switch changes from the closed position to the open position.

12. The method of claim 11, further comprising performing a calibration procedure to calibrate the linear isolation amplifier at a single point.

13. The method of claim 9, wherein the adjusting the output voltage is performed by a multiplying digital to analog converter (MDAC), wherein the calibrating comprises:
receiving an inverting voltage at a first input of a comparator;

comparing the inverting voltage to a reference voltage, supplied from the low voltage side; outputting a high signal to a counter when the inverting voltage is below the reference voltage wherein the counter counts up; and when the counter counts up, turning off a set of transistors, coupled to an output of the counter, and to an input of the output amplifier.

14. The method of claim 13, further comprising:

sending a second signal to the calibration pin, to set the calibration pin in a high state;

receiving at a clock coupled to the counter, an OFF signal from the calibration pin that the calibration pin is in a high state; and turning off the clock, wherein the counter is maintained at a current count state when the OFF signal is received.

15. A linear isolation amplifier, comprising:

a servo amplifier, disposed on a high voltage side of the linear isolation amplifier;

an output amplifier, disposed on a low voltage side of the linear isolation amplifier;

a first optocoupler circuit, electrically coupled to an output side of the servo amplifier, and comprising a first LED, optically coupled to an input side of the output amplifier;

a calibration circuit, electrically coupled to the output amplifier, to generate a calibration initiation signal;

a second optocoupler circuit, electrically coupled to the calibration circuit, and disposed to receive the calibration initiation signal, and further comprising a second LED, optically coupled to a reference switch on the high voltage side, wherein the reference switch is arranged to reversibly provide a reference voltage to the servo amplifier; and a multiplying digital to analog converter (MDAC), coupled to the output amplifier and to the calibration circuit.

16. The linear isolation amplifier of claim 15, the first optocoupler circuit comprising:

the first LED being coupled between a voltage source line and the servo amplifier; and a first photodetector, disposed on the high voltage side, coupled to receive an LED output from the first LED, and further coupled to an input of the servo amplifier; and a second photodetector, disposed on the low voltage side, coupled to receive the LED output from the first LED, and further coupled to output amplifier circuit.

17. The linear isolation amplifier of claim 15, comprising, a differential amplifier, having a differential amplifier output node;

a first switch, disposed between the differential amplifier output node and an input of the servo amplifier;

a second switch, coupled on a first side to the second optocoupler circuit, and coupled on a second side to the input of the servo amplifier; and a first reference voltage source, having an output coupled to the second switch.

* * * * *